United States Patent [19]

Milnes et al.

[11] 4,159,354

[45] * Jun. 26, 1979

[54] METHOD FOR MAKING THIN FILM III-V COMPOUND SEMICONDUCTORS FOR SOLAR CELLS INVOLVING THE USE OF A MOLTEN INTERMEDIATE LAYER

[76] Inventors: Arthur G. Milnes, 1417 Inverness Ave., Pittsburgh, Pa. 15217; Donald L. Feucht, 193 Penhurst Dr., Pittsburgh, Pa. 15235

[*] Notice: The portion of the term of this patent subsequent to Nov. 23, 1993, has been disclaimed.

[21] Appl. No.: 741,012

[22] Filed: Nov. 11, 1976

Related U.S. Application Data

[63] Continuation-in-part of Ser. No. 566,308, Apr. 9, 1975, Pat. No. 3,993,533.

[51] Int. Cl.$^2$ .................................................. H01L 31/18
[52] U.S. Cl. .................................... 427/74; 136/89 TF; 148/174; 148/175; 156/607; 156/613; 427/86; 427/87
[58] Field of Search .................... 427/74, 86, 87; 148/174, 175; 156/607, 613; 136/89 SG, 89 TF

[56] References Cited

U.S. PATENT DOCUMENTS

| | | | |
|---|---|---|---|
| 3,139,361 | 6/1964 | Rasmanis | 148/175 |
| 3,713,900 | 1/1973 | Suzuki et al. | 148/175 |
| 3,862,859 | 1/1975 | Ettenberg et al. | 427/86 |
| 3,993,533 | 11/1976 | Milnes et al. | 427/87 |
| 4,053,326 | 10/1977 | Forrat | 136/89 TF |

OTHER PUBLICATIONS

Blum et al., "Vapor Growth of GaP onto Si Substrates", IBM Technical Disc. Bull., vol. 13, No. 5, p. 1245 (1970).

Blum et al., "Fabrication of Alloy Semiconductors", IBM Tech. Disc. Bull., vol. 13, No. 5, Oct. 1970, p. 1195.

Cuomo et al., "Fabrication of Large Grain Polycrystalline Thin Films", IBM Tech. Disc. Bull., vol. 18, No. 9, Feb. 1976, pp. 3063-3064.

Tarui et al., "Rheotaxial Growth of Si with Ge-Si Alloys", Bul. Elec. Lab., vol. 30, No. 1, pp. 109-116 (1966).

Konagai et al., "Thin Film GaAlAs-GaAs Solar Cells by Peeled Film Technology", Spring Meeting Electrochemical Soc., Wash., D.C., May 1976, vol. 76-1, pp. 554-555.

Milnes et al., "Peeled Film Technology for Solar Cells", 11th IEEE Photospecialist Conference, May 6-8, 1975, pp. 338-341.

Primary Examiner—Harris A. Pitlick
Attorney, Agent, or Firm—Buell, Blenko & Ziesenheim

[57] ABSTRACT

Thin semiconductor films of compounds from groups III-V of the periodic table suitable for solar cells are formed on low cost substrates by forming on the substrate an intermediate film that is chemically related to but has a lower melting point than the desired semiconductor. The desired semiconductor film is then grown on this intermediate film while it is in a molten condition. The molten intermediate layer isolates the substrate from the desired semiconductor layer so that as that layer grows, large area crystals result. The intermediate film may be a semiconductor III-V compound or may be a group III metal alloy.

39 Claims, 5 Drawing Figures

METHOD FOR MAKING THIN FILM III-V COMPOUND SEMICONDUCTORS FOR SOLAR CELLS INVOLVING THE USE OF A MOLTEN INTERMEDIATE LAYER

This application is a continuation-in-part of applicants' copending application, Ser. No. 566,308, filed Apr. 9, 1975, entitled METHOD FOR MAKING SEMICONDUCTORS FOR SOLAR CELLS, now U.S. Pat. No. 3,993,533 of Nov. 23, 1976.

Our invention relates to improved methods or processes for making thin semiconductor film from compounds of elements from groups III and V of the periodic table for use in solar cells. More particularly, our invention is concerned with methods for making films of predominantly large crystal grain sizes, many tens of micrometers in diameter in the plane of the film, of certain III-V compounds named hereinafter on low cost substrates such as aluminum sheets, oxide coated aluminum sheets, oxide based ceramics, carbon, glass, quartz and aluminum-oxide-coated iron or other metals. By following the methods of the invention involving two growth layers, the desired film produced has much larger grain size than can be achieved by direct growth of the desired semiconductor on the low cost substrate. Hence the effects of grain boundaries on the minority carrier recombination are reduced and the material is more suitable for efficient solar cell use.

The Group III metals for semiconductors with which this application is concerned comprise, Al, Ga and In. The Group V non-metals for semiconductors comprise P, As and Sb. The semiconductor films for solar cell use described herein comprise: (a) GaAs (and related semiconductors such as $GaAs_x Sb_{1-x}$, $Ga_x Al_{1-x} As$, $Ga_x In_{1-x} As$, $GaAs_x P_{1-x}$, and $Ga_x Al_{1-x} As_y P_{1-y}$, (b) InP (and related semiconductors such as $In_x Ga_{1-x} P$, $In_x Al_{1-x} P$, $InP_x Sb_{1-x}$, $Ga_x In_{1-x} As_y P_{1-y}$) and (c) AlSb (and related semiconductors such as $Al_x Ga_{1-x} Sb$, $Al_x In_{1-x} Sb$, $AlAs_x Sb_{1-x}$ and $Al_y Ga_{1-y} Sb_x As_{1-x}$).

It is an object of our invention to provide a process of producing semiconductors films of Group III-V compounds having large grain size suitable for solar cells. It is another object to provide a process of producing such films on low cost substrates. It is another object to provide a process of producing such films in a strain-relieved state. It is still another object to provide a process of producing such films free from contact energy barriers. It is yet another object to provide a process of producing such films having low bulk voltage drops thereacross. Other objects of our invention will become evident in the course of the following description thereof.

PRIOR ART AND THE PROBLEM PRESENTED TO THE INVENTORS

Present methods of fabricating solar cells involve the growth of single crystal ingots or tapes of silicon from a melt, but these processes are high in cost. Experimental work under study for reducing costs involves the use of less Si by the condensation of a thin Si layer from the pyrolytic decomposition of $SiHCl_3$ or $SiH_4$, or related compounds, onto cheap substrates to create a thin film layer of Si for subsequent fabrication into solar cells. These methods do not produce cells of good conversion efficiency (electrical energy divided by incident solar energy) since the Si is almost always highly polycrystalline and of low minority carrier lifetime ($10^{-10}$–$10^{-8}$ sec.) due to recombination centers and impurities associated with the crystal structure. Lifetimes in the range $10^{-5}$–$10^{-8}$ sec. are required for Si solar cells of acceptable efficiency, 5%–10% and higher, since the photons are absorbed deep in the semiconductor because silicon is an indirect gap semiconductor.

The polycrystallinity is associated with the nature of the substrate and the lattice mismatch between the substrate and the Si layer at the deposition temperature, which is typically in the range 900°–1200° C. for the $SiHCl_3$ decomposition process. It is also difficult to find a cheap substrate that will withstand these temperatures and not interact with the Si in a way harmful to the development of a semiconductor layer of good minority carrier lifetime. For instance, if thin iron sheet is the substrate, there is a tendency for Fe-Si compounds to form. If a copper sheet is used, there are troublesome Cu-Si compounds formed, and in any case Cu is a lifetime destroyer in Si. If a molybdenum substrate is used, the silicon is polycrystalline and cracking may occur, even though the thermal expansion coefficient mismatch is less between these two materials than most metal-silicon combinations. A further objection to polycrystalline Si films is that impurity migration down grain boundaries may occur during subsequent processing steps, such as diffusion, and harm the cell performance.

Other semiconductors such as GaAs and InP have bandgaps that are good matches to the solar spectrum but are too expensive to use in single-crystal wafer form, unless possibly used in conjunction with lenses or reflective surfaces to concentrate the solar energy, but concentrators themselves are expensive, particularly if they must track the movement of the sum. However, GaAs and InP are of considerable potential interest as very thin film solar cells because the cost would then be lower and because they are direct gap semiconductors with steep photon-absorption edges, so that a thickness of only a few microns of the semiconductor is needed to absorb the solar photons. Attempts have been made to produce thin film cells by the evaporation or deposition of thin layers of GaAs (and other semiconductors) on low cost substrates, see the work of Vohl, et al. IEEE Trans Electron Devices ED-14, p. 26 (1967). In this work, 15–50 μm thick GaAs films were deposited by $H_2O$ vapor growth on Mo or Al substrates and solar cells made by formation of Pt Schottky barriers or a $Cu_{1.8}Se$ heterojunction. The efficiencies observed were about 4.5% for tungsten illumination and cells were not stable in performance with time and temperature. When pn junctions were formed by Zn diffusion the cells had low shunt resistance that was attributed to rapid diffusion along the grain boundaries. The low efficiencies observed were related to recombination at grain boundaries and series- and shunt-resistance effects associated with the grain boundaries. Very little work has been reported on polycrystalline InP cells although single crystal InP cells like single crystal GaAs cells are believed to be capable of high solar cell efficiency (>16%).

THE INVENTORS' SOLUTION TO THE PROBLEM

The present invention comprises preferably, the provision of an intermediate semiconductor layer of low resistance between the substrate and the desired Group III-V semiconductor layer, which results in much larger crystal grain sizes. Large crystal grain size material is preferred for improved solar cell efficiency. At the growth temperature of the desired semiconductor layer the intermediate semiconductor layer is molten and acts as a buffer layer between the desired layer and the substrate. If the intermediate layer, as proposed in this invention, has elements in common with the desired film and reacts with it, the composition of the surface of the intermediate layer will change in chemical composition. By diffusion the bulk of the intermediate layer will also change and if the process proceeded unimpeded to equilibrium the composition of the intermediate layer would change so that the intermediate layer became solid at the desired growth temperature. However, because of diffusion there will be a concentration gradient across the layer with the surface having a higher concentration of species of the elements of the desired layer. Thus the surface will solidify before the inner portion of the intermediate layer, and allow the desired semiconductor to form solid nucleating islands of large crystal grain size floating on the surface of the liquid intermediate layer. In this manner the crystallinity of the surface solid is isolated from the substrate-crystal structure. This process may be aided by establishing a temperature gradient across the intermediate film by R-F heating of the substrate and cooling of the surface by the flowing gases of the growth system, or by otherwise adjusting the heat losses in a resistance heated furnace.

A desirable objective of retaining a liquid layer very near the substrate throughout most of the growth is that mechanical strain in the desired growing layer is reduced. As diffusion of the desired growing material occurs towards the substrate, it is sometimes advantageous to raise the growth temperature some tens or even hundreds of degrees during the growth process so that the interface at the substrate remains liquid in spite of the diffusion process.

In some growths good results can be obtained by growing the intermediate layer and while it is still solid growing over it a very thin layer of the desired semiconductor at a low temperature as a preliminary coating, the purpose of which is to prevent deterioration of the intermediate layer semiconductor by partial evaporation of the most volatile constituent during subsequent heating or by contamination. If the intermediate layer is a metal alloy the initial thin coating of the desired semiconductor serves to limit balling up of the metal by surface tension during subsequent heating. Once the very thin layer is grown on top of the intermediate layer the whole sandwich is raised in temperature to above the melting point of the intermediate layer so that melt-back by interalloying occurs of all of the initial thin layer of the desired semiconductor while in an atmosphere conducive to the continued growth of the desired semiconductor. The interalloying is self-limiting by the temperature chosen and by solubility considerations and development of the desired solid semiconductor film of large crystal grain size on the surface of the liquid intermediate layer proceeds as previously described.

With these techniques, the desired film, therefore, can be grown with a grain size that is large compared with its thickness. On cool down to room temperature, the intermediate layer solidifies in a way that relieves stress in the structure and the adhesion to the substrate is good. Some roughening of the substrate before growth or a very thin coating of a reactive metal such as Ti may also be used to improve the adhesion.

The use of a chemically related semiconductor as the intermediate layer has several advantages over the use of a metal or glass. There is a better lattice constant match with the desired semiconductor. There is usually a better match of the coefficient of thermal expansion that reduces dislocations, strain and cracking in the desired surface layer. The interface between the desired semiconductor and the interface intermediate layer semiconductor, because of chemical compatibility, lattice match, cleanliness and grading of the junction tends to have a lower surface recombination velocity than at a semiconductor-metal or semiconductor-glass interface or semiconductor-substrate interface. Hence, the lower surface recombination allows the desired semiconductor layer to be thinner than it otherwise would have to be. The cleanliness referred to above comes about because usually the chemical deposition growth process involved can be swung from deposition of the intermediate semiconductor to growth of the desired semiconductor in the same growth system in a very short time without much exposure to a non-growing condition. The intermediate semiconductor layer also serves to buffer contamination from the substrate surface or bulk and prevent it reaching the desired semiconductor. Since, if the doping is controlled, an isotype heterojunction forms at the interface between the intermediate layer and the desired semiconductor, this may make an excellent ohmic contact with suitable doping control, yet retain a lower surface recombination velocity for minority carriers and also give the backfield action desirable in solar cells.

In U.S. Pat. No. 3,139,361 of June 30, 1964, Method of Forming Single Crystal Films on a Material in Fluid Form E. Rasmanis describes a process by which single crystal Si or Ge is grown on a thin molten layer of metal (including lead, cadmium, thallium, bismuth and tin) or of glass. However, in the Rasmanis patent no examples are given for any application of the process to the growth of single crystal III-V semiconducting compounds. U.S. Pat. No. 3,139,361 claims non-reacting fluid layers but does not name specifically the materials to be used for the fluid layers, other than by the generic designation of glass and metals.

DESCRIPTION OF A PREFERRED EMBODIMENT OF THE INVENTION

In the description of our invention we refer to the attached drawings, in which.

Figure 3:
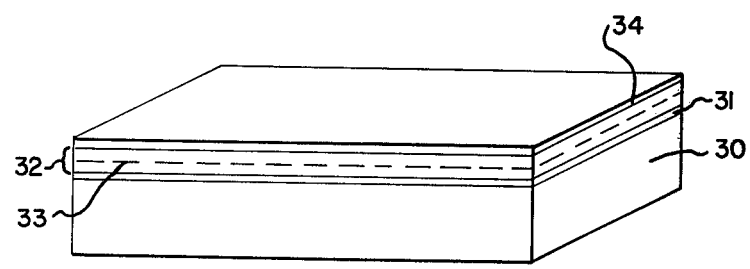

FIG. 3 is a schematic diagram of the invention as it relates to a film of np InP grown on an InSb layer on a carbon substrate. The InP has an overcoating of $Al_{0.45}In_{0.55}P$ as a heteroface. This is explained later in example 3 of the specification.

Figure 4:
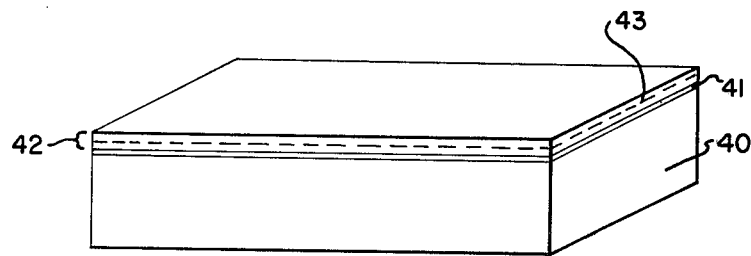

FIG. 4 is a schematic diagram of the invention as it relates to a film of AlSb grown on an InSb layer on a carbon substrate.

Figure 5:
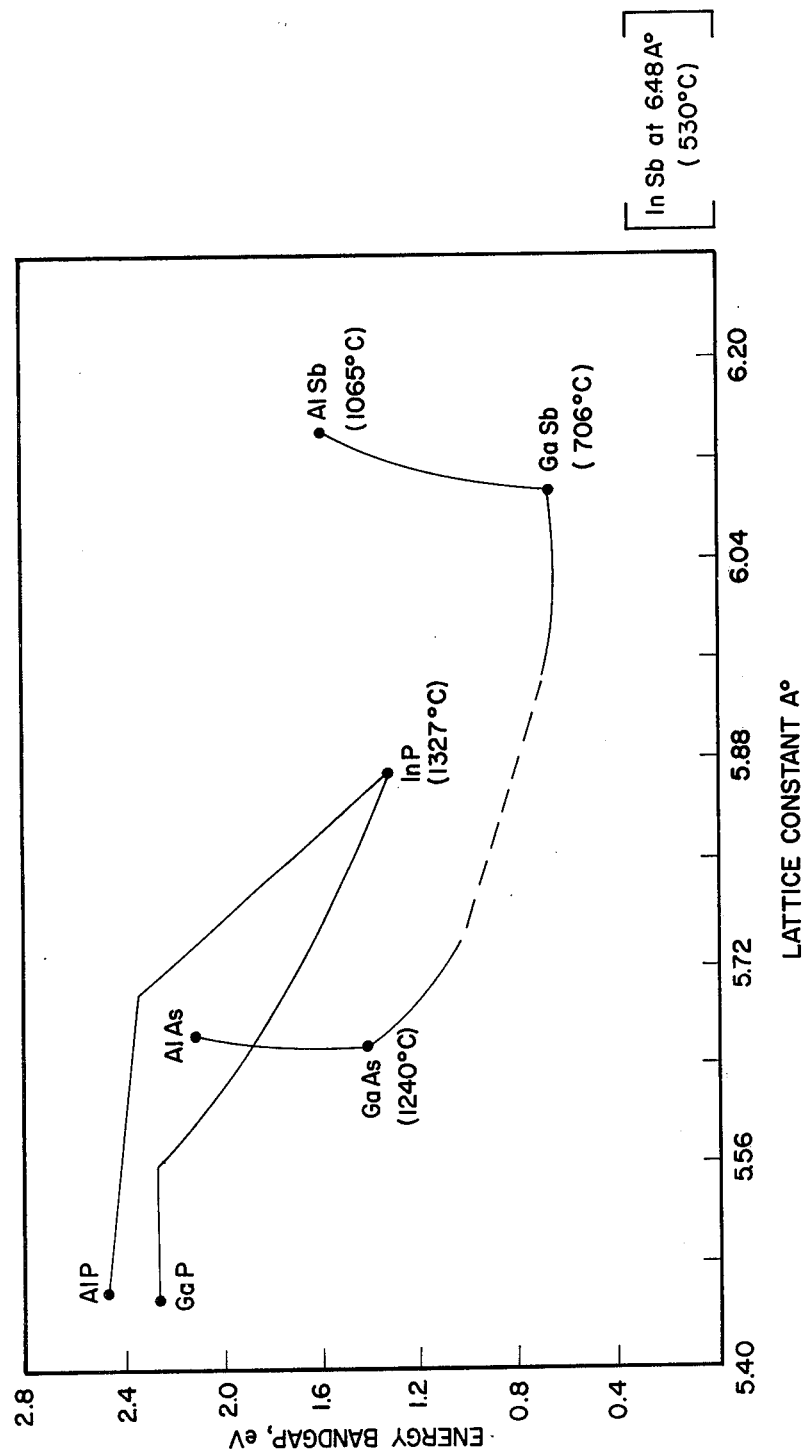

FIG. 5 is a diagram of the energy gap and lattice constant variations of various III-V compound semiconductor alloys.

Figure 1:
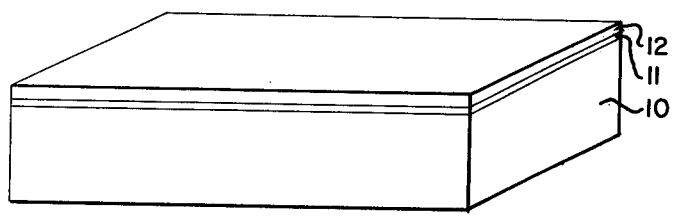
FIG. 1 is a schematic diagram of a preferred embodiment of the invention as it relates to a thin film GaAs layer grown on an intermediate layer of GaSb grown on a carbon substrate.

FIG. 1 shows a slab of carbon 10 which may be 0.5 cm thick and some tens of square centimeters of area. On this is grown a thin layer of GaSb 11 or GaSb$_x$As$_{1-x}$ by exposure to an atmosphere of Ga, HCl, SbH$_3$, AsH$_3$ and H$_2$ at a temperature of about 650° C. following the method of Clough and Tietjen (Met. Soc. AIME 245, p. 583, 1969). Alternatively the GaSb or GaSb$_x$As$_{1-x}$ layer may be grown by other chemical vapor deposition processes or by other evaporation or sputtering processes well known to those skilled in the III-V semiconductor epitaxy art, as described for example in the book by Milnes and Feucht, "Heterojunctions and Metal Semiconductor Junctions," Wiley 1972. The layer thickness should preferably be between 2 and 5 μm to conserve material and limit the growing time, but a wide range of thickness is possible. The doping of the layer should preferably be p type which can be secured by the inclusion of a little Zn or other known p type dopant in the reaction chamber.

The atmosphere is then changed so that the AsH$_3$ is increased and the SbH$_3$ reduced to a zero or low level and the temperature is then raised to between 720°-800° C. Under these conditions, As diffuses into the liquid intermediate layer, forming a GaAs$_x$Sb$_{1-x}$ solution with a higher As concentration at the surface. When the As concentration becomes large enough (determined by the phase diagram and the temperature of the intermediate film) a solid layer of GaAs$_x$Sb$_{1-x}$ is formed. GaAs 12 then grows on this GaAs$_x$Sb$_{1-x}$ and molten GaSb intermediate layer (the melting point of GaSb being 706° C.). The GaAs develops as a thin solid film of large grain size until the desired film thickness, typically 5-20 μm, is achieved. The growth temperature may be raised some tens of degrees during the growth process to assist in maintaining a liquid interface at the substrate. Then the system is flushed with hydrogen and slowly cooled to room temperature. In the last micrometer, or so, of the growth the layer may be doped n-type by the introduction of a low concentration of H$_2$S or H$_2$Se gas into the reaction chamber. This step forms an n junction on the p GaAs so that the desired solar cell junction is formed.

Alternatively the GaSb intermediate layer and GaAs desired film may be grown n type by the inclusion of H$_2$Se or H$_2$S in the reaction chamber. In this instance in the last micrometer, or so, of growth of the GaAs layer the doping may be made p type by the introduction of Zn or other known p type dopant so that a p on n junction is formed.

The np or pn junction step is not necessary if the solar cell is to be created by formation of a Schottky barrier junction by a very thin semi-transparent metal layer over the desired film.

For adjustment of the bandgap to match the solar spectrum more efficiently, the desired layer may be grown as a ternary or quaternary compound of Ga, As and alloys thereof with Al, In, Sb, P, In and P, In and Al, In and Sb, Al and Sb, and Al and P. Examples are Ga$_x$In$_{1-x}$As, GaAs$_y$P$_{1-y}$, Al$_x$Ga$_{1-x}$As$_y$P$_{1-y}$ and Al$_x$Ga$_{1-x}$As$_y$Sb$_{1-y}$.

Suitable growth rates and gas flow rates and concentrations may be found by consulting the known literature on CVD epitaxy of GaAs, for instance see the papers of J. J. Tietjen and coworkers referenced in the book Heterojunctions and Metal Semiconductor Junctions previously mentioned.

Figure 2:
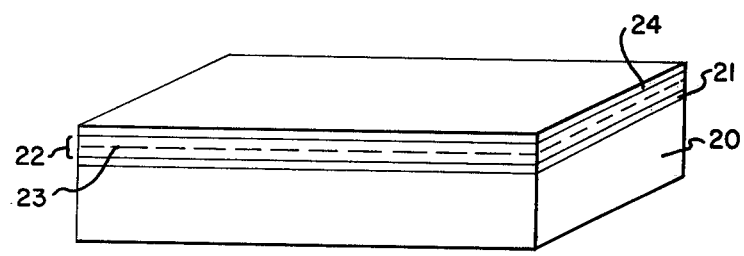
FIG. 2 is a schematic diagram of the invention as it relates to a film of p $Al_xGa_{1-x}As$ grown on GaAs containing a pn junction that has been grown on a GaSb intermediate layer on a carbon substrate. This is a further development of the preferred embodiment of the invention.

In an alternative, equally preferred, form of the invention, the intermediate GaSb or GaSb$_x$As$_{1-x}$ layer is grown by the decomposition of trimethyl-gallium (or triethyl-gallium) in the presence of SbH$_3$ or trimethyl-antimony (or triethyl-antimony) with AsH$_3$ present if x is less than 1. Temperatures of 700°-725° C. are suitable, see Manasevit and Simpson, J. Electrochem Soc. Vol. 116, p. 1725 (1969). Once the intermediate layer is grown, the SbH$_3$ or trimethyl-antimony stream is turned off and the AsH$_3$ level increased so that GaAs$_x$Sb$_{1-x}$ is formed on the surface and GaAs is grown as the desired semiconductor with the temperature raised to about 750°-850° C. so that the intermediate layer is molten. An np junction may be created in the GaAs if desired by manipulation of dopant gas streams, for instance of diethyl-zinc and H$_2$S. Then trimethyl-aluminum (or triethyl-aluminum) may be introduced into the reaction chamber to grow a thin layer of Al$_x$Ga$_{1-x}$As (with for example x=0.7) to act as a heteroface window to the solar cell and control the surface recombination. (Heteroface structures are described in Hovel, Solar Cells, Vol. 11 of Semiconductors and Semimetals, Academic Press 1975). This then results in the structure shown in FIG. 2, where the substrate 20 is coated with the intermediate layer of GaSb 21, which in turn is coated with the GaAs layer 22 having an np junction 23 shown by a dotted line, and the heteroface 24 is Al$_x$Ga$_{1-x}$As.

Other examples of suitable heteroface window layers are ternary and quaternary semiconductors of the desired group III-V compound alloyed with one or two elements selected from Ga, In, Al, P, As and Sb. This includes compounds such as GaAs$_x$P$_{1-x}$, Al$_x$Ga$_{1-x}$As$_y$P$_{1-y}$, and Ga$_x$In$_y$Al$_{1-x-y}$P with bandgaps in excess of 1.8 eV. Some quaternary compounds are easier to grow than ternary compounds and so are preferred.

Although the substrate is usually carbon, it may also be glass, ceramic, quartz or aluminum-oxide coated iron, or any other metal that is capable of withstanding the temperature of the reaction chamber and is suitably non-reactive with the reaction chamber atmosphere and suitably low in cost. If the substrate is insulating, the ohmic connection to the base of the film can be achieved by contacting the GaSb with an etch that removes part of the GaAs overcoat.

The lattice constant of GaSb is 6.095 A° and that of GaAs is 5.654° and the thermal expansion coefficients of the two materials are relatively similar, being $6.9 \times 10^{-6}$ C.$^{-1}$ and $5.8 \times 10^{-6}$ C.$^{-1}$, respectively. The expansion coefficient of carbon varies with the type of fabrication but is usually in the range of $3.5-7 \times 10^{-6}$ C.$^{-1}$.

Important factors in the selection of GaSb for the intermediate layers are that:

(a) the melting temperature 706° C. is suitably below the 750° C. needed for the growth of GaAs, (b) the growth process of the two materials, which have gallium as a common element, are very similar, so the change-over from the growth of one to that of the other is easy to arrange, (c) some workers report a miscibility gap in the center of the alloying range between GaSb and GaAs. This, if present, may contribute to the results obtained by limiting the interalloying, (d) the electron affinity of GaSb is almost the same as that of GaAs, hence in a pp heterojunction between the two materials, one would theorize an energy barrier spike in the valence band to impede the ohmic contact action. Because of grading between the two materials, it is expected that this barrier would essentially be eliminated. In an nn heterojunction between these materials there will be no energy spike so the films might also be made n type. Generally in n GaAs, the hole minority carrier diffusion length $L_p$ is less than $L_n$ the electron minority carrier diffusion length in p type GaAs and therefore p type doping is preferable. However, for Schottky barrier solar cells, the barrier junction height may be greater on n type GaAs than on p type GaAs and the cell output voltage therefore greater and so n type material is usually preferable.

Other suitable intermediate layer materials are InSb, $GaSb_yP_{1-y}$, $InSb_yP_{1-y}$, and $InSb_yAs_{1-y}$.

ADDITIONAL EXAMPLES

Further examples that may be used to illustrate the nature of the invention follow.

EXAMPLE 2

InP (5–20 μm) thin film (melting point 1327° C., lattice constant 5.87° A) of large crystal grain size is grown as the desired semiconductor film for solar cell use on an intermediate (1–5 μm) molten layer of InSb (melting point 530° C., lattice constant 6.48° A) on a carbon, quartz, glass, ceramic, oxide coated aluminum, or other suitable substrate. The growth of the InSb may be from an atmosphere of In, $InCl_3$, HCl, $SbH_3$ and $H_2$ at a temperature of about 500° C. Then, $PH_3$ can be substituted for the $SbH_3$ and the temperature can be raised to above 530° C. to the range 600°–750° C. and the desired InP film grown. The bandgap of InP is 1.27 eV and is well suited for solar cells of air-mass-one efficiency of 15 or 16%. However, the bandgap can be raised by the addition of $GaCl_3$ to the reaction chamber, for instance $Ga_{0.2}In_{0.8}P$ has a bandgap of about 1.6 eV. With this a larger output voltage and a better high temperature performance may be obtained at the expense of some photon collection.

For adjustment of the bandgap to match the solar spectrum more efficiently, the desired layer may be grown as a ternary or quaternary compound of In, P, and alloys thereof with Ga, Al, As, Sb, Ga and Al, Ga and Sb, Ga and As, Al and Sb, and Al and As. Examples are $In_xGa_{1-x}P$, $InP_ySb_{1-y}$, $Al_xIn_{1-x}P$, $Al_xIn_{1-x}P_yAs_{1-y}$.

In place of InSb the intermediate layer may be ternary such as $InSb_yP_{1-y}$ or $In_xGa_{1-x}Sb$, or a quaternary such as $Al_xIn_{1-x}Sb_yP_{1-y}$ to improve the growths.

EXAMPLE 3

The InP thin film is grown on InSb or $InSb_yP_{1-y}$ on a substrate with the use of the organo-metallic compounds trimethyl-indium (or triethyl-indium) and stibine ($SbH_3$) or trimethyl-antimony and phosphine ($PH_3$). A suitable p type dopant is diethylzinc and $H_2Se$ or $H_2S$ are suitable n type dopants. By doping either pInP-pInSb or nInP-nInSb layers may be grown. After the formation of the pn junction in the InP, trimethyl-gallium or trimethyl-aluminum can be added to the reaction gases and a layer of a micrometer or two of $Ga_xIn_{1-x}P$ or $Al_yIn_{1-y}P$ grown to provide a heteroface window to reduce the surface recombination velocity at the InP surface. An example of such a structure is shown in FIG. 3 where on a carbon substrate 30 is grown the InSb intermediate layer 31. On this is grown the InP active solar cell layer 32 containing the pn junction 33 indicated by the dotted line and the heteroface layer 34 is $Al_yIn_{1-y}P$. If y is 0.45, the bandgap of the $Al_{0.45}In_{0.55}P$ is about 2.3 eV and the lattice constant is about 5.685 A°. For convenience of understanding, the variations of energy gap and lattice constants for various III–V compound semiconductor alloys are shown in FIG. 5.

EXAMPLE 4

Another growth method available for an InP film is to first grow InSb on the substrate from In vapor and $SbH_3$ in $H_2$ at a low pressure such as $-10^{-3}$ Torr with the substrate at 350°–400° F. with a trace of doping gas present. Then the substrate temperature is raised to about 550° C. and phosphine, $PH_3$, is substituted for the $SbH_3$, and the desired InP layer grown. Fraas, et al. (App. Phys. Letters 28 p. 415, 1976) using an In vapor $PH_3$ process have grown high quality InP layers on CdS seeds. An advantage of this process is that the substrate temperature may be low and so allow the use of inexpensive substrates.

EXAMPLE 5

In another example of the invention, InSb may be grown from a gas stream containing some or all of the materials In, $InCl_3$, HCl, $SbCl_3$, $SbH_3$ and $H_2$ at a temperature of about 500° C. Then the temperature is raised above the melting point of the InSb and a desired InP or $In_xGa_{1-x}P$ layer grown from a gas stream containing some or all of the materials In, $InCl_3$, HCl, $PCl_3$, $PH_3$ and $H_2$.

EXAMPLE 6

AlSb is an indirect gap semiconductor with an energy bandgap of 1.6 eV, a lattice constant of about 6.14 A° and a melting point of 1065° C. Since this is an indirect gap semiconductor the solar cell layer must be a little thicker than for direct materials like GaAs and InP, but quite efficient current collection should be possible in a layer 15 to 20 μm thick.

The film growth as an example of the invention proceeds first by the 1–5 μm growth of GaSb (melting point 706° C., lattice constant 6.095 A°) on the substrate from trimethyl-gallium and $SbH_3$ and $H_2$ at about 650° C. Trimethyl-aluminum is then introduced into the gas stream in place of the trimethyl-gallium and the temperature in the reaction chamber raised to 750° C. or somewhat above and AlSb or $Al_xGa_{1-x}Sb$ grown to the required layer thickness with suitable doping and junction. After growth and cell fabrication the AlSb surface is preferably sealed against water vapor to prevent deterioration with humidity. The layer structure is shown in FIG. 4 where the substrate 40 is covered by the GaSb layer 41 and the latter by the desired $Al_xGa_{1-x}Sb$ layer 42, including the pn junction 43.

In this structure the intermediate layer 41 may alternatively be InSb (melting point 530° C.), or an alloy $In_yGa_{1-y}Sb$ formed by the introduction of trimethyl-indium into the reaction chamber. Triethyl compounds may be used instead of trimethyl compounds.

For adjustment of the bandgap to match the solar spectrum more efficiently, the desired layer may be grown as a ternary or quaternary compound of Al, Sb and alloys thereof with Ga, In, or Ga and As, or Ga and P, or In and P. Examples are $Al_xIn_{1-x}Sb$, $Al_xGa_{1-x}Sb_yP_{1-y}$, and $Al_xIn_{1-x}Sb_yP_{1-y}$.

EXAMPLE 7

GaAs layers for solar cell use may also be grown by flash evaporation onto a molten layer of InSb at about 550° C. The molten layer is chosen to be InSb and not GaSb, because the lower melting point of InSb allows the GaAs to be deposited at a temperature that does not involve too much reevaporation of the arsenic so that GaAS of good semiconductor quality is obtained. Good flash evaporation of InSb is possible at temperatures in the range 300°–400° C. (see Richards, et al. J. Appl. Phys. 34, p. 3418, 1963).

The substrate in this instance may be many possible materials including carbon, ceramics, aluminum, iron and copper, since the process temperature is very low.

As further comment, all the highest growth temperatures given for the GaAs, InP and AlSb growing processes are above 660° C., but most of the processes will provide crystalline growth to temperatures as low as 600° C. Furthermore, flash-evaporation processes will grow crystalline material down to even lower temperatures (see for instance Table 9.2 and page 256 of the book "Heterojunctions and Metal Semiconductor Junctions," previously mentioned). Therefore, it becomes possible in this invention to use aluminum sheet or oxide-coated aluminum sheet as the substrate. This is advantageous since Al sheet is relatively cheap and is obtainable with large grain sizes.

Uncoated iron substrates should be suitable for the flash evaporation process of growth but are less suitable for the processes involving high temperatures and reactive chemicals. Iron, for instance, is a deep dopant in GaAs.

In place of using a semiconductor layer as the intermediate layer, as described in the previous examples, a metal which reacts with the desired semiconductor could be used. In this regard In, Al or Ga or their alloys are the desired metals. In the preferred form In, an alloy substantially with Al or Ga or both, is used for the desired semiconductor containing In as one element, Ga alloys with In or Al or both for the desired films containing Ga as one of the elements and Al or its alloys substantially with other group III metals for the desired films containing Al as one of the elements.

The intermediate film may be formed on the substrate by any suitable process which will produce a film or layer of the desired compound of the desired thickness. The film may be formed in place, coated, or prefabricated and applied to the substrate. The desired semiconductor film, however, must be grown on the molten intermediate film. It may be grown by any of the methods mentioned herein or other methods which will give a film of the desired compound of the desired thickness on the molten intermediate film.

In the foregoing specification we have described presently preferred embodiments of our invention; however, it will be understood that our invention can be otherwise embodied within the scope of the following claims.

We claim:

1. A process for producing on a substrate and affixed thereto a film of a desired group III-V semiconductor compound suitable for use in solar cells comprising:

(a) forming on a substrate an intermediate film of III-V semiconductor compound having a melting point lower than that of the desired group III-V semiconductor compound;

(b) heating the film to render it molten, while maintaining the substrate solid;

(c) growing a solid film of the desired group III-V semiconductor compound on the molten intermediate film at a temperature above the melting temperature of that film, while maintaining the substrate solid, whereby that molten film isolates the film of the desired group III-V semiconductor compound from the substrate and promotes the formation of large crystals of the desired group III-V semiconductor compound, but does not impair bonding thereof to the substrate.

2. The process of claim 1 in which the desired group III-V compound is selected from the group consisting of Ga, As, and alloys thereof with P, Sb, In, Al, AlP or InP.

3. The process of claim 2 in which the intermediate film is selected from the group consisting of GaSb, InSb, $GaSb_xAs_{1-x}$, $GaSb_yP_{1-y}$, $InSb_yP_{1-y}$ and $InSb_yAs_{1-y}$.

4. The process of claim 1 in which the desired III-V compound is selected from the group consisting of In, P and alloys thereof with Sb, Al or Ga.

5. The process of claim 4 in which the intermediate film is selected from the group consisting of InSb, $InSb_yP_{1-y}$, $In_xGa_{1-x}Sb$ and $Al_xIn_{1-x}Sb_yP_{1-y}$.

6. The process of claim 1 in which the desired group III-V compound is selected from the group consisting of Al, Sb and alloys thereof with Ga, In, GaAs, GaP or InP.

7. The process of claim 6 in which the intermediate film is selected from the group consisting of GaSb, InSb and $In_yGa_{1-y}Sb$.

8. The process of claim 1 including the further step of growing on the film of the desired group III-V semiconductor compound a very thin film of ternary or quaternary compound semiconductor of the desired group III-V compound alloyed with one or two elements selected from the group consisting of Ga, In, Al, P, As and Sb to provide a heteroface window thereon.

9. The process of claim 1 in which the Group V element is decomposed from a hydride or chloride thereof.

10. The process of claim 1 in which the group III or V element is decomposed from a methyl or ethyl compound thereof.

11. The process of claim 1 in which the film of the desired group III-V semiconductor compound is grown on the interface film by flash evaporation.

12. The process of claim 1 in which the substrate is a refractory selected from the group consisting of carbon, quartz, ceramic and glass.

13. The process of claim 1 in which the substrate is a metal selected from the group consisting of Fe, Al, Cu and oxides of those metals.

14. A process for producing on a substrate and affixed thereto a film of a desired group III-V semiconductor compound suitable for use in solar cells comprising:

(a) forming on a substrate an intermediate film of a group III metal having a melting point lower than that of the desired group III-V semiconductor compound;

(b) heating the film to render it molten while maintaining the substrate solid; and (c) growing a film of the desired group III-V semiconductor compound on the molten intermediate film at a temperature above the melting temperature of that film, while maintaining the substrate solid, whereby that molten film isolates the film of the desired group III–V semiconductor compound from the substrate and promotes the formation of large crystals of the desired group III–V semiconductor, but does not impair bonding thereof to the substrate.

15. The process of claim 14 in which the desired group III–V compound is selected from the group consisting of Ga, As, and alloys thereof with P, Sb, In, Al, AlP or InP.

16. The process of claim 15 in which the intermediate film is selected from the group consisting of Ga, Al, In, GaAl, GaIn, AlIn and GaAlIn.

17. The process of claim 14 in which the desired III–V compound is selected from the group consisting of In, P and alloys thereof with Sb, Al or Ga.

18. The process of claim 17 in which the intermediate film is selected from the group consisting of Ga, Al, In, GaAl, GaIn, AlIn and GaAlIn.

19. The process of claim 14 in which the desired group III–V compound is selected from the group consisting of Al, Sb and alloys thereof with Ga, In, GaAs, GaP or InP.

20. The process of claim 19 in which the intermediate film is selected from the group consisting of Ga, Al, In, GaIn, AlIn and GaAlIn.

21. The process of claim 14 including the further step of growing on the film of the desired group III–V semiconductor compound a very thin film of ternary or quaternary compound semiconductor of the desired group III–V compound alloyed with one or two elements selected from the group consisting of Ga, In, Al, P, As and Sb to provide a heteroface window thereon.

22. The process of claim 14 in which the group V element is decomposed from a hydride or chloride thereof.

23. The process of claim 14 in which the group III or V element is decomposed from a methyl or ethyl compound thereof.

24. The process of claim 14 in which the film of the desired group III–V semiconductor compound is grown on the interface film by flash evaporation.

25. The process of claim 14 in which the substrate is a refractory selected from the group consisting of carbon, quartz, ceramic and glass.

26. The process of claim 14 in which the substrate is a metal selected from the group consisting of Fe, Al, Cu and oxides of those metals.

27. A process for producing on a substrate and affixed thereto a film of a desired group III–V semiconductor compound suitable for use in solar cells comprising:
 (a) forming on a substrate an intermediate film selected from the group consisting of III–V semiconductor compounds having melting points lower than that of the desired group III–V semiconductor compound, and the group III metals for semiconductors and their alloys;
 (b) growing a thin portion of the desired group III–V semiconductor film on the solid intermediate film;
 (c) heating the intermediate film and the thin portion of the desired semiconductor film to a temperature sufficient to render the films molten while maintaining the substrate solid, while continuing to grow the desired film; and
 (d) growing a solid film of the desired group III–V semiconductor compound on the composite molten intermediate film at a temperature above the solidification temperature of that molten film while maintaining the substrate solid, whereby that molten film isolates the film of the desired group III–V semiconductor from the substrate and promotes the formation of large crystals of the desired group III–V semiconductor compound, but does not impair bonding thereof to the substrate.

28. The process of claim 27 in which the desired group III–V compound is selected from the group consisting of Ga, As, and alloys thereof with P, Sb, In, A, AlP or InP.

29. The process of claim 28 in which the intermediate film is selected from the group consisting of Ga, Al, In, GaSb, $GaSb_xAs_{1-x}$, GaAl, GaIn, AlIn and GaAlIn.

30. The process of claim 27 in which the desired III–V compound is selected from the group consisting of In, P and alloys thereof with Sb, Al or Ga.

31. The process of claim 30 in which the intermediate film is selected from the group consisting of InSb, $InSb_yP_{1-y}$, Ga, In, Al, GaAl, GaIn, AlIn and GaAlIn.

32. The process of claim 27 in which the desired group III–V compound is selected from the group consisting of Al, Sb and alloys thereof with Ga, In, GaAs, GaP or InP.

33. The process of claim 32 in which the intermediate film is selected from the group consisting of GaSb, InSb Ga, Al, In, GaAl, GaIn, AlIn and GaAlIn.

34. The process of claim 27 including the further step of growing on the film of the desired group III–V semiconductor compound a very thin film of ternary or quaternary compound semiconductor of the desired group III–V compound alloyed with one or two elements selected from the group consisting of Ga, In, Al, P, As and Sb to provide a heteroface window thereon.

35. The process of claim 27 in which the group V element is decomposed from a hydride or chloride thereof.

36. The process of claim 27 in which the group III or V element is decomposed from a methyl or ethyl compound thereof.

37. The process of claim 27 in which the film of the desired group III–V semiconductor compound is grown on the interface film by flash evaporation.

38. The process of claim 27 in which the substrate is a refractory selected from the group consisting of carbon, quartz, ceramic and glass.

39. The process of claim 27 in which the substrate is a metal selected from the group consisting of Fe, Al, Cu and oxides of those metals.

* * * * *

UNITED STATES PATENT AND TRADEMARK OFFICE
CERTIFICATE OF CORRECTION

PATENT NO. : 4,159,354
DATED : June 26, 1979
INVENTOR(S) : Arthur G. Milnes and Donald L. Feucht It is certified that error appears in the above–identified patent and that said Letters Patent are hereby corrected as shown below:

Column 2, line 34, "sum" should be --sun--.

Column 8, line 13, "$-10^{-3}$" should read -- $10^{-3}$ --.

Column 8, line 40, "direct materials" should read --direct gap materials--.

Signed and Sealed this

Eleventh Day of December 1979

[SEAL]

Attest:

Attesting Officer

SIDNEY A. DIAMOND

Commissioner of Patents and Trademarks